United States Patent
Gupta et al.

(10) Patent No.: US 10,990,717 B2
(45) Date of Patent: Apr. 27, 2021

(54) SOFTWARE SIMULATION METHOD FOR ESTIMATING FLUID POSITIONS AND PRESSURES IN THE WELLBORE FOR A DUAL GRADIENT CEMENTING SYSTEM

(71) Applicant: Halliburton Energy Services, Inc., Houston, TX (US)

(72) Inventors: Gaurav Gupta, Katy, TX (US); Zhuoming Lou, Sugar Land, TX (US); Dhaval Trivedi, Gujarat (IN)

(73) Assignee: Halliburton Energy Services, Inc., Houston, TX (US)

( * ) Notice: Subject to any disclaimer, the term of this patent is extended or adjusted under 35 U.S.C. 154(b) by 487 days.

(21) Appl. No.: 15/746,383

(22) PCT Filed: Sep. 2, 2015

(86) PCT No.: PCT/US2015/048069
§ 371 (c)(1),
(2) Date: Jan. 19, 2018

(87) PCT Pub. No.: WO2017/039649
PCT Pub. Date: Mar. 9, 2017

(65) Prior Publication Data
US 2018/0196898 A1    Jul. 12, 2018

(51) Int. Cl.
*G06F 30/20*    (2020.01)
*E21B 33/13*    (2006.01)
(Continued)

(52) U.S. Cl.
CPC .............. *G06F 30/20* (2020.01); *E21B 33/13* (2013.01); *E21B 33/143* (2013.01);
(Continued)

(58) Field of Classification Search
CPC .......... G06F 30/20; G06F 30/25; G06F 30/27; G06F 30/28; E21B 33/13; G01V 3/18; G06Q 50/02
(Continued)

(56) References Cited

U.S. PATENT DOCUMENTS

| | | | | |
|---|---|---|---|---|
| 6,102,673 A | * | 8/2000 | Mott | ........................ E21B 21/01 417/392 |
| 6,394,195 B1 | * | 5/2002 | Schubert | ............... E21B 21/001 166/359 |

(Continued)

FOREIGN PATENT DOCUMENTS

| | | |
|---|---|---|
| WO | WO-2014127059 A2 | 8/2014 |
| WO | WO-2014/194210 A1 | 12/2014 |

OTHER PUBLICATIONS

Michael Mulcahy ("Dual Gradient Drilling Technology At Work After Long Development Cycle", Compass Publications Inc. Sea Technology, 2014, pp. 1-3) (Year: 2014).*

(Continued)

*Primary Examiner* — Iftekhar A Khan
(74) *Attorney, Agent, or Firm* — Thomas Rooney; C. Tumey Law Group PLLC

(57) ABSTRACT

A dual gradient cementing system is modeled in a modeled subsea wellbore. The modeled dual gradient cementing system comprises a plurality of components including a mud lift pump (MLP) coupling a subsea rotating device (SRD) to a surface mud return line, wherein the MLP is located at a subsea depth and the SRD diverts annular fluids from an annulus away from a riser. The modeled dual gradient cementing system is simulated in operation, wherein a fluid loss value of 100% at the subsea depth of the MLP is assumed, and a fluid property of a simulated non-static fluid in the simulated dual gradient cementing system while in operation is estimated. Thereafter, an actual dual gradient (Continued)

cementing operation is performed in an actual subsea wellbore, wherein an actual non-static fluid corresponding to the simulated non-static fluid exhibits the fluid property.

20 Claims, 7 Drawing Sheets

(51) Int. Cl.
  *G06Q 50/02* (2012.01)
  *E21B 33/14* (2006.01)
  *E21B 41/00* (2006.01)
  *G01V 3/18* (2006.01)
(52) U.S. Cl.
  CPC ............ *E21B 41/0007* (2013.01); *G01V 3/18* (2013.01); *G06Q 50/02* (2013.01)
(58) Field of Classification Search
  USPC .......................................................... 703/10
  See application file for complete search history.

(56) References Cited

U.S. PATENT DOCUMENTS

| | | | |
|---|---|---|---|
| 6,474,422 B2* | 11/2002 | Schubert | E21B 21/001 175/25 |
| 6,499,540 B2* | 12/2002 | Schubert | E21B 21/08 166/250.08 |
| 6,607,042 B2* | 8/2003 | Hoyer | E21B 21/08 175/38 |
| 7,027,968 B2* | 4/2006 | Choe | E21B 21/001 175/60 |
| 7,093,662 B2* | 8/2006 | deBoer | E21B 33/0355 166/358 |
| 7,497,266 B2* | 3/2009 | Fossli | E21B 21/10 166/358 |
| 8,033,335 B2* | 10/2011 | Orbell | E21B 17/01 166/367 |
| 8,162,063 B2* | 4/2012 | Humphreys | E21B 7/12 166/358 |
| 9,328,575 B2* | 5/2016 | Feasey | E21B 21/001 |
| 10,233,741 B2* | 3/2019 | Kronenberger | E21B 21/001 |
| 2002/0066571 A1* | 6/2002 | Schubert | E21B 21/08 166/363 |
| 2002/0066596 A1* | 6/2002 | Judge | E21B 33/085 175/5 |
| 2002/0129943 A1* | 9/2002 | Maus | E21B 21/106 166/358 |
| 2003/0062199 A1* | 4/2003 | Gjedebo | E21B 21/001 175/66 |
| 2003/0130134 A1* | 7/2003 | Oram | C09K 8/02 507/118 |
| 2003/0139916 A1* | 7/2003 | Choe | E21B 41/0007 703/10 |
| 2003/0217866 A1* | 11/2003 | deBoer | E21B 21/06 175/66 |
| 2004/0007392 A1* | 1/2004 | Judge | E21B 21/001 175/206 |
| 2004/0065440 A1* | 4/2004 | Farabee | E21B 21/14 166/358 |
| 2004/0238177 A1* | 12/2004 | Fossli | E21B 21/001 166/364 |
| 2008/0302570 A1 | 12/2008 | deBoer | |
| 2010/0147593 A1* | 6/2010 | Hariharan | E21B 21/066 175/66 |
| 2011/0024195 A1* | 2/2011 | Hoyer | E21B 21/08 175/65 |
| 2011/0036588 A1* | 2/2011 | Heironimus | E21B 21/001 166/345 |
| 2011/0100471 A1* | 5/2011 | Schroeder | E21B 21/10 137/2 |
| 2011/0100710 A1* | 5/2011 | Fossli | E21B 21/08 175/7 |
| 2012/0067590 A1* | 3/2012 | Fossli | E21B 21/10 166/367 |
| 2012/0080186 A1* | 4/2012 | Reed | E21B 21/001 166/267 |
| 2012/0103619 A1* | 5/2012 | Schroeder | E21B 21/10 166/332.2 |
| 2012/0227978 A1* | 9/2012 | Fossli | E21B 43/38 166/363 |
| 2013/0118752 A1* | 5/2013 | Hannegan | E21B 33/16 166/336 |
| 2014/0008055 A1* | 1/2014 | Allamon | E21B 34/14 166/194 |
| 2014/0040259 A1 | 2/2014 | Takematsu et al. | |
| 2014/0224487 A1* | 8/2014 | Budde | E21B 21/08 166/285 |
| 2015/0027717 A1* | 1/2015 | Ma | E21B 21/001 166/345 |
| 2015/0240578 A1* | 8/2015 | Duman | F04B 43/02 166/351 |
| 2016/0097240 A1* | 4/2016 | Ren | E21B 21/001 175/5 |
| 2016/0102541 A1* | 4/2016 | Kronenberger | E21B 44/00 73/152.18 |
| 2016/0326856 A1* | 11/2016 | Wise | G06F 30/20 |
| 2017/0306986 A1* | 10/2017 | McLean, Jr. | F04F 13/00 |
| 2018/0073314 A1* | 3/2018 | Reitsma | E21B 33/02 |
| 2018/0196898 A1* | 7/2018 | Gupta | G06Q 50/02 |

OTHER PUBLICATIONS

Schumacher et al. ("Subsea Mudlift Drilling: Planning and Preparation for the First Subsea Field Test of a Full-Scale Dual Gradient Drilling System at Green Canyon 136, Gulf of Mexico", SPE, 2001, pp. 1-11) (Year: 2001).*
FR Search Report for FR1657478 dated Feb. 2, 2019.
Andreas Hanekamhaug, "Sensitivity Analysis on Dual Gradient Drilling", Master's Thesis, Faculty of Science and Technology 2014.
Kristian Waernes, "Applying Dual Gradient Drilling in Complex Wells, Challenges and Benefits", Master's Thesis, Faculty of Science and Technology, 2014.
Bibek Das et al., "Dual-Gradient System Evaluation Highlights Key Highrisk Issues", MPD: Advancing Deepwater Drilling, Jul. 2012.
"Achieving Wellbore Integrity with Sound Technical Decision Making", Anonymous: "iCern Service Brocure", Halliburton, HO8264, Aug. 2011.
Tarald Husevag Gaup, "Simulations of Dual Gradient Drilling: Analytical and Theoretical Studies of tripping- and pressure trapping operations when using Dual Gradient Drilling in deep waters", Norwegian University of Science and Technology, Jun. 2012.
Kjartan Om Sigurjonsson, "Dual Gradient Drilling Simulations", Norwegian University of Science and Technology, May 2011.
International Search Report and Written Opinion from PCT/US2015/048069, dated May 18, 2016, 17 pages.
Stress Engineering Services, Inc., "Risk Profile of Dual Gradient Drilling," May 2011, 111 pages.

* cited by examiner

SOFTWARE SIMULATION METHOD FOR ESTIMATING FLUID POSITIONS AND PRESSURES IN THE WELLBORE FOR A DUAL GRADIENT CEMENTING SYSTEM

BACKGROUND

The present disclosure relates to subterranean formation operations, and more particularly, to software simulation methods for estimating fluid properties in a wellbore during a simulated or actual dual gradient cementing operation.

Hydrocarbons (i.e., oil and gas) reside in reservoirs in subterranean formations on land, in inland waters, and offshore areas around the world. The term "subsea" refers to exploration, drilling, and development of hydrocarbons in underwater oceanic locations. The development of subsea hydrocarbon reservoirs requires specialized equipment capable of safeguarding the environment, protecting subsea operators, and enabling subsea exploration to be economically feasible.

A variety of subsea systems are available for drilling a wellbore in a subterranean formation below a water surface (e.g., below the seabed floor) and for producing hydrocarbons therefrom, including floating drilling vessels, floating oil platforms, fixed offshore platforms, jackup drilling rigs, and the like. The type and complexity of such subsea systems often increases with increasing water depths in which drilling is taking place. As such, as the water depth increases, the cost and technical difficulty of drilling wellbores therein also increases. Such cost and technical difficulties include managing dynamic and static fluid pressures within the wellbore to maintain drilling within acceptable pressure ranges between the pore pressure and fracture gradient pressure of the particular subsea formation, particularly at increased depths where fracture gradient decreases.

One method used in drilling subsea wellbores at such deep water depths is dual-gradient drilling. Dual-gradient (DG) drilling techniques seek to adjust the density of the column of fluid contained in the wellbore. Traditional single-gradient drilling technology controls wellbore pressure by using a column of substantially constant-density drilling fluid from the bottom of the wellbore to the top, such as to the drilling rig. In contrast, DG drilling seeks to control wellbore pressure by using a lower density fluid, about the same density as the water above the formation (e.g., seawater above the seabed floor), from the rig to the seafloor, and a higher density drilling fluid within the actual formation, from the seafloor to the bottom of the wellbore. DG drilling techniques, in effect, simulate the drilling rig being located on the seafloor and therefore manages the pressures present during the drilling operation. This pressure management also alleviates prior constraints on the depth to which casing string could be inserted without vast reductions in the diameter of the string.

After drilling a wellbore in a subsea location, zonal isolation of the wellbore is achieved by forming a cement sheath therein. The cement sheath is formed by introducing casing string into the wellbore, thereby forming an annulus between the wall of the wellbore and the casing string, and pumping a cement slurry into the annulus. The cement slurry cures to form the cement sheath which, inter alia, supports and positions the casing string in the wellbore, bonds the exterior surface of the casing string formation, maintains zonal isolation between the environment and the wellbore (e.g., prevents contamination), and increases the structural integrity of the wellbore. This process is termed "primary cementing," or simply "cementing," as used herein.

Both drilling and primary cementing in a DG system (i.e., a "DG drilling system and operation," and a "DG cementing system and operation," respectively) are not devoid of challenges, despite enhanced pressure management. For instance, during drilling and cementing, leaks, kicks, pressure surges, and potential blowouts are possible. As an example, increased pressure surges during running casing string in the wellbore may induce fluid losses that can jeopardize the wellbore. Additionally, formation breakdown in the annulus during a cementing operation may also result in pressure fluctuations resulting in fluid losses to the formation.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

DETAILED DESCRIPTION

Figure 1:
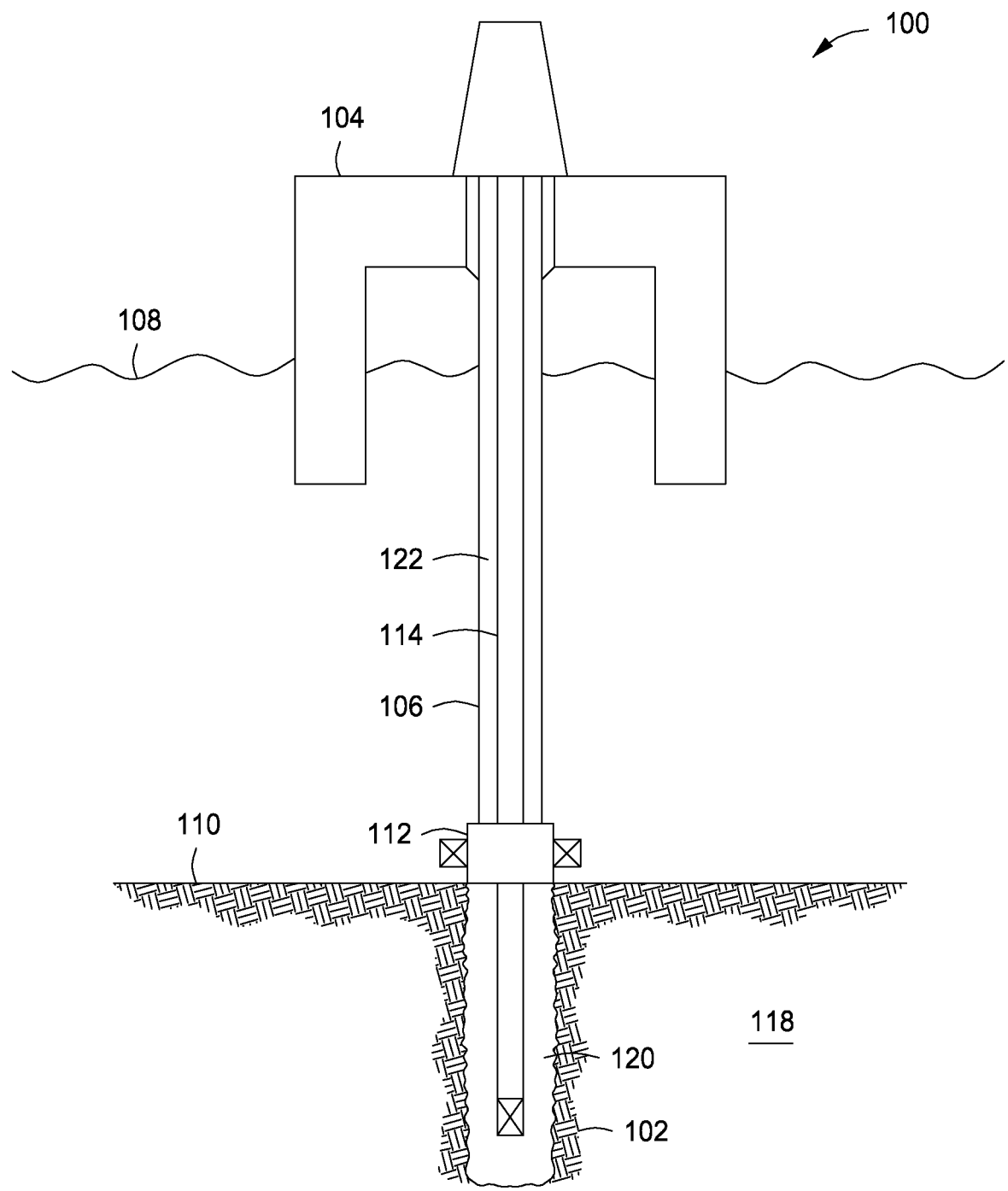
FIG. 1 illustrates a conventional, single-gradient well system, as described herein.

The present disclosure relates to subterranean formation operations, and more particularly, to software simulation methods for estimating fluid properties in a wellbore during a simulated or actual dual gradient cementing operation.

More specifically, the embodiments of the present disclosure allow monitoring and estimating a quality of a fluid property during a simulated or actual dual gradient (DG) cementing operation. Such monitoring and estimation allows the development of a DG cementing system for actual use that is optimized for an actual operation, adjustment of actual real-time DG cementing operations to perform real-time optimization, and generally increasing the reliability and success of DG cementing operations. Accordingly, some embodiments herein allow operators to simulate a DG cementing operation and then perform manipulations to the simulated system to enhance the reliability and effectiveness thereof. In other embodiments, operators can simulate actual real-time DG cementing operation and perform one or more manipulations to the actual operation to increase the reliability and effectiveness of a DG cementing operation already in progress, including using inputs from data received real-time.

One or more illustrative embodiments disclosed herein are presented below. Not all features of an actual implementation are described or shown in this application for the sake of clarity. It is understood that in the development of an actual embodiment incorporating the embodiments disclosed herein, numerous implementation-specific decisions must be made to achieve the developer's goals, such as compliance with system-related, lithology-related, business-related, government-related, and other constraints, which vary by implementation and from time to time. While a developer's efforts might be complex and time-consuming, such efforts would be, nevertheless, a routine undertaking for those of ordinary skill in the art having benefit of this disclosure.

Moreover, it will be appreciated that while the embodiments herein are described with reference to subsea operations, the methods and systems described herein are equally applicable to other subterranean formation cementing operations using a DG system for recovery of hydrocarbons from an underwater location, including fresh water, shallow and deep seawater, and the like, without departing from the scope of the present disclosure.

While compositions and methods are described herein in terms of "comprising" various components or steps, the compositions and methods can also "consist essentially of" or "consist of" the various components and steps. When "comprising" is used in a claim, it is open-ended.

As used herein, the term "substantially" means largely, but not necessarily wholly.

The use of directional terms such as above, below, upper, lower, upward, downward, left, right, uphole, downhole and the like, are used in relation to the illustrative embodiments as they are depicted in the figures, the upward direction being toward the top of the corresponding figure and the downward direction being toward the bottom of the corresponding figure, the uphole direction being toward the surface of the well and the downhole direction being toward the toe of the well.

The embodiments herein describe methods and systems for monitoring, sensing, controlling, and/or logging that are capable of tracking any one or more of several system parameters of a plurality of non-static simulated or actual fluids during a DG cementing operation using software simulation and/or monitoring. As used herein, the term "during a DG cementing operation" encompasses operations, fluids used therewith, and the like, occurring directly before or after the cementing operation. For example, the movement of drilling fluid from a wellbore in anticipation of performing primary cementing is included in the term "during a DG cementing operation." As used herein, the term "non-static," which may be used interchangeably with "circulating," with reference to a simulated or actual fluid refers to a fluid in motion or otherwise experiencing movement (e.g., vibration). The fluids described herein are generally non-static as then are flowing through the DG cementing system at one or more locations, including removal to a surface location above the water surface. As used herein, the term "surface" (including "water surface" or "sea surface") refers to the interface between water (e.g., the ocean) and the atmosphere. The term "seafloor" (or "seabed") refers to the interface between the Earth's crust and water (e.g., the ocean).

As previously described, unlike conventional subsea drilling and cementing systems, the dual gradient drilling and cementing systems described herein utilize two-fluid densities to manage pressures of the system and simulate drilling as though at a surface location. As illustration, FIG. 1 shows a conventional, single-gradient subsea well system 100 (e.g., for drilling and/or cementing). The system 100 may be used to drill and cement wellbore 102. A subsea riser 106 extends from the drilling rig 104 at the surface 108, through the seafloor, and is coupled to a subsea wellhead 112 located at the seafloor 110. The riser 106 may be coupled to a blowout preventer (not shown) in the subsea wellhead 112. As used herein, the term "riser" refers to a hollow pipe that couples a drilling rig to a subsea wellhead and which receives fluid for return to above a sea surface; the riser prevents such fluids from spilling out of the top of the subsea wellhead and onto the seafloor. The riser is often large in diameter and acts as a temporary extension of the wellbore to the surface. As used herein, the term "drilling rig" refers to a platform located above the sea surface (e.g., floating, permanent, jackup, and the like) housing machinery and equipment for drilling a wellbore. Such drilling rigs typically comprise mud tanks, mud pumps, a derrick or mast, drawworks, a rotary table, drill string, and the like. A "subsea wellhead" (or simply "wellhead"), as used herein, refers to the seafloor termination of a wellbore that at least incorporates facilities for installing casing hangers during the wellbore cementing phase, and which provides some amount of pressure control.

As shown, a work string 114 extends within the riser 106 from the drilling rig 104, through the subsea wellhead 112, and into the wellbore 102. The work string 114 may be a drill string for drilling the wellbore 114 or a conveyance for delivering cement slurry, for example, in a cementing operation. The term "work string," as used herein, refers to any tubing string used to introduce a fluid or perform a downhole operation, including coiled and jointed tubing string (e.g., to introduce cement slurry to form a cement sheath).

Referring to a drilling operation, single-gradient systems, like system 100, circulate drilling mud or other fluids (e.g., spacer fluids) from the bottom of the work string 114 while drilling through the subterranean formation 116 below the seafloor 110 to form the wellbore 102. The mud then exits the work string 114 into the annulus 120 in the wellbore 102 and further up through subsea wellhead 112 into the annulus 122 between the riser 106 and the work string 114 above the seafloor 110. The density of the drilling mud for drilling the wellbore 102 is necessary to maintain drilling within acceptable pressure ranges between the pore pressure gradient and fracture gradient pressure of the formation 118. Failure to do so could result in failure issues, which could lead to discharge of drilling mud or other wellbore fluids into the ocean, failure or damage to the wellbore 120, or blowout of the subsea wellhead 112, among other hazards. As used herein, the term "pore pressure gradient" (or simply "pore pressure") refers to the pressure of fluids within the pores of a formation (e.g., a wellbore) at a given depth. The term "fracture gradient," as used herein, refers to the pressure required to induce fractures in a formation (e.g., a wellbore) at a given depth.

As the drilling mud exits a drill bit at the bottom of the work string 114, and traverses past the subsea wellhead 112 into the annulus 122 of the riser 106, the density difference of the drilling mud in the annulus 122 of the riser 106 and the surrounding seawater of the ocean results in extreme pressures at the "mud line," or the seafloor, and, thus, at the subsea wellhead 112. Accordingly, only one pressure gradient exists that begins at the surface 108 and extends to the bottom of the wellbore 102 and the full pressure of the entire column of drilling mud is experienced, which elevates the pressure on the subsea wellhead 112 as well. Such elevated internal pressures at the subsea wellhead 112 increase the possibility of a blowout and require additional casing strings, shallow casing points, longer and heavier risers 106, and bigger and more expensive rigs 104.

Figure 2:
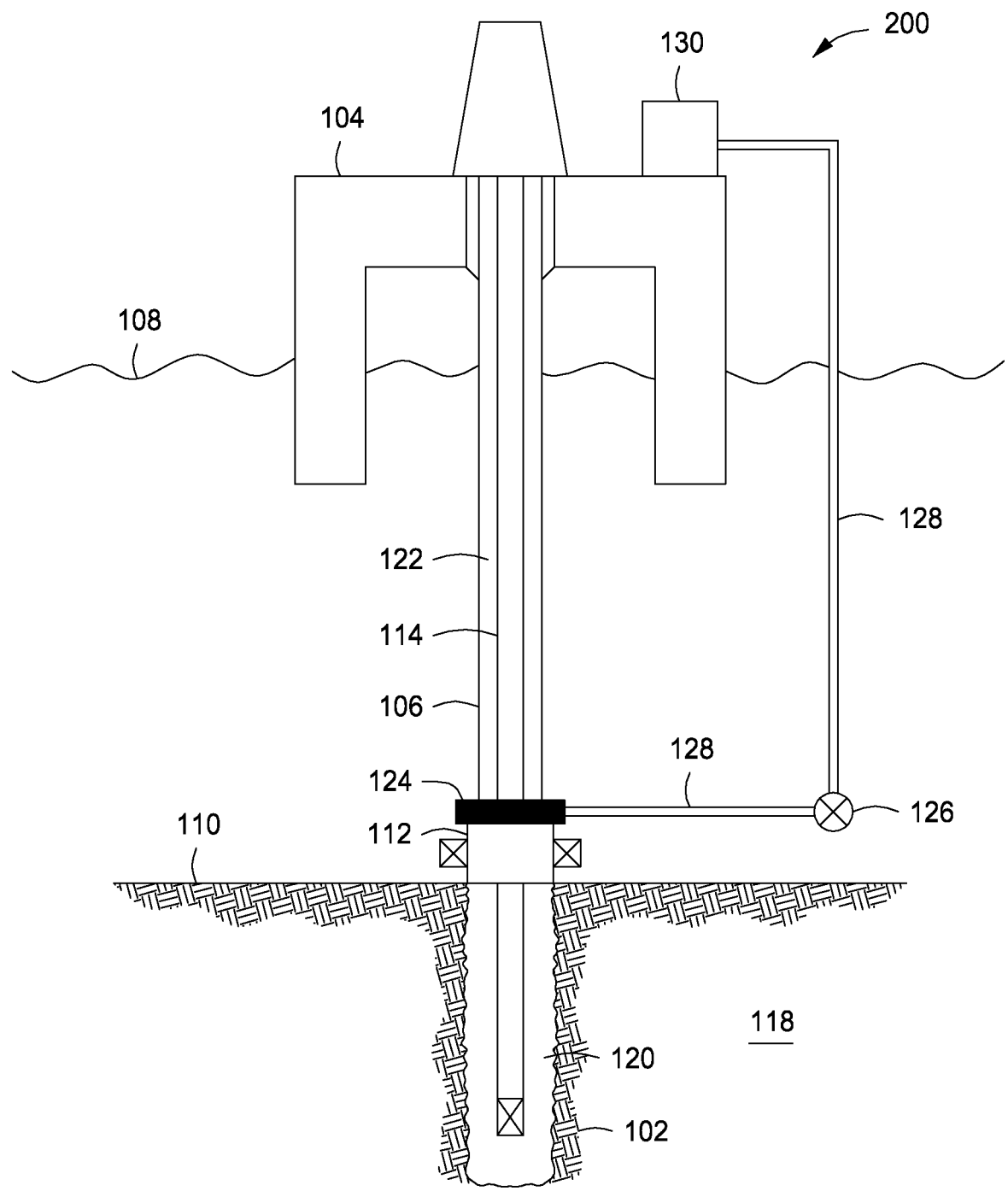
FIG. 2 illustrates a dual-gradient well system, according to one or more embodiments of the present disclosure.

To combat the pressure issues experienced with traditional, single-gradient systems, DG systems have been developed, as shown in FIG. 2. Referring now to FIG. 2, with continued reference to FIG. 1, illustrated is a DG subsea well system 200 (e.g., for drilling and/or cementing). Like the single-gradient system 100 in FIG. 1, the DG system 200 comprises a drilling rig 104, a work string 114, a riser 106, a subsea wellhead 112, and a wellbore 102. Additionally, as part of (i.e., integral to) the subsea wellhead 112 or otherwise in operation in concert with, a subsea rotating device (SRD) 124 is in line with the subsea wellhead 112. As used herein, a "subsea rotating device" is equipment configured to divert annular return fluids (e.g., drilling mud) away from the annulus 122 of the riser 106. That is, the SRD 124 does not interfere with the work string 114 or the fluids within the work string 114 traversing past the SRD 124, past the subsea wellhead 112 and into the wellbore 120, and similarly does not prevent any fluids traveling back toward the seafloor 110 in the annulus 120 of the wellbore 102. However, the SRD 124 blocks the flow of such fluids past the SRD 124 and into the annulus 122 of the riser 106. It will be appreciated that although the SRD 124 is shown above the subsea wellhead 112, the SRD 124 may be located below the subsea wellhead 112 or integral with the subsea wellhead 112, without departing from the scope of the present disclosure.

The SRD 124 is fluidly coupled to a mud lift pump (MLP) 126 via a surface mud return line 128. The surface mud return line 128 may deliver the annular fluids from to a receiving tank 130. The term "mud lift pump" refers to a pump configured to deliver fluids (e.g., drilling mud or fluid, spacer fluids, and the like) from a location below the seafloor (e.g., in the wellbore below the seafloor, or in some instances in the riser above the seafloor, but below the sea surface) up a surface mud return line. The "surface mud return line" refers to a hollow pipe for conveying fluids to a surface location. The term "casing string" refers to a pipe (which may be threaded or otherwise attached to additional casing string pipes in segments, if necessary) that is lowered into a wellbore and cemented in place therein.

It will be appreciated, that although a receiving tank 130 is shown on the surface of drilling rig 104, any receptacle capable of receiving the fluids from the surface mud return line 128 may be used in accordance with the embodiments of the present disclosure, including a separate floating rig or vessel, a pipeline configured to deliver the fluids offsite, and the like. In operation, the DG system 200 has a fluid (e.g., seawater) in the annulus 122 of the riser 106 that is of the same or substantially of the same density as the surrounding seawater (e.g., a low-density). Accordingly, the low-density fluid (e.g., sea-water) thus remains static in the annulus 122 of the riser 106. Drilling or cementing operations take place by pumping appropriately dense fluids through the work string 114 and out into the annulus 120 of the wellbore 102. However, unlike conventional, single-gradient systems (e.g., system 100 of FIG. 1), the fluids from the annulus 120 of the wellbore 102 are prevented from rising into the annulus 122 of the riser 106 and instead are diverted into the surface mud return line 120 by operation of the SRD 124 and the MLP 126. The configuration of the DG system 200 can reduce the internal pressure on the subsea wellhead 122 at the seafloor by as much as about 50% because, while high density mud or fluid is used in the wellbore, it does not enter into the riser.

Figure 3:
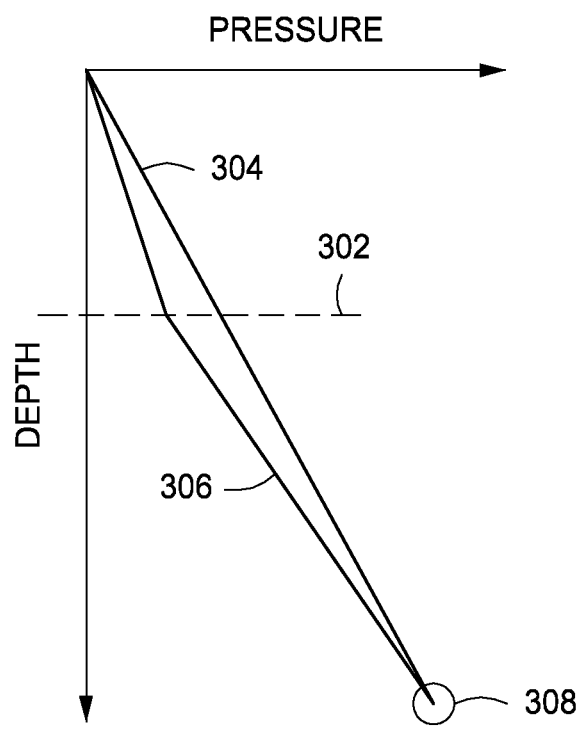
FIG. 3 is a graph illustrating the difference in hydrostatic pressures between a dual-gradient well system and a single-gradient well system, according to one or more embodiments of the present disclosure.

Accordingly, the DG system 200 creates two hydrostatic gradients, a seawater-like gradient from the surface 108 to the seafloor 110 to manage the wellbore 102, and a high-density gradient from the seafloor 110 to the bottom of the wellbore 102 to prevent the wellbore 102 from collapsing and for removing cuttings or other debris and fluids therefrom. The dual hydrostatic gradients do not affect the bottomhole pressure, which is unchanged as compared to a single-gradient system. FIG. 3 illustrates the difference in hydrostatic pressures between a DG system and a single-gradient system, thus showing the dual hydrostatic pressure phenomenon of a DG system 200. Referring now to FIG. 3, the x-axis represents pressure and the y-axis represents depth. Dashed line 302 is the seafloor 110 (FIGS. 1 & 2), also referred to as the "mud line." Line 304 represents a single-gradient system and line 306 represents a DG system. As can be seen, two pressure gradients are represented by line 306, but both line 306 and line 304 meet at the same bottomhole pressure 308.

Figure 4:
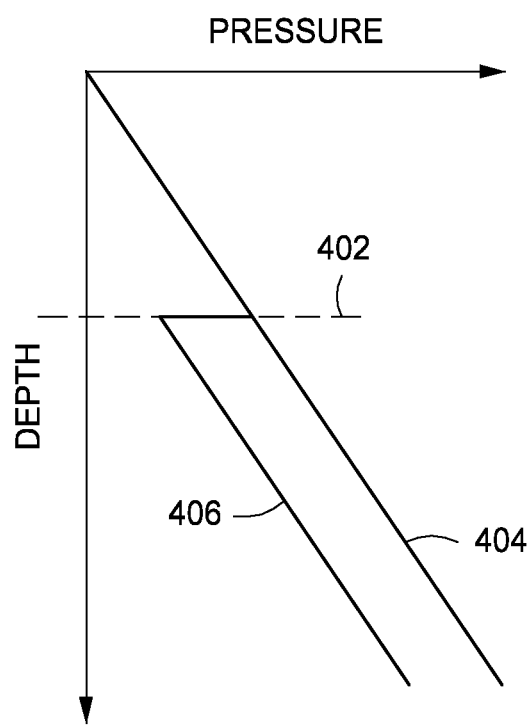
FIG. 4 is a graph illustrating the difference in hydrostatic pressures experienced by a work string and annuli as part of a dual-gradient well system, according to one or more embodiments of the present disclosure.

Referring now to FIG. 4, illustrated is a graph depicting the difference in pressures experienced by a work string 114 and annuli in a DG system 200 (FIG. 2). Referring now to FIG. 4, the x-axis represents pressure and the y-axis represents depth. Dashed line 402 is the seafloor 110 (FIG. 2), also referred to as the "mud line." Line 404 represents the pressure experienced by the work string 114 (e.g., a drill string) and line 406 represents the pressure experienced by the annuli 122 and 120, either in the riser 106 or in the wellbore 102, respectively (FIG. 2). That is, line 406 above the seafloor 110 is the annulus 122 in the riser 106, whereas line 406 below the seafloor 110 is the annulus 120 in the wellbore 102. As can be seen, the pressure experienced by the work string 114, represented by line 404, and the annulus 120 is identical above the seafloor 110, where it thereafter diverges and the pressure experienced by the annulus 120 in the wellbore 102 decreases relative to the work string 114. This is because the fluids in the annulus 122 in the riser 106 are typically lighter than the fluids in the annulus 120 in the wellbore 102, thus resulting in different pressures.

Figure 5:
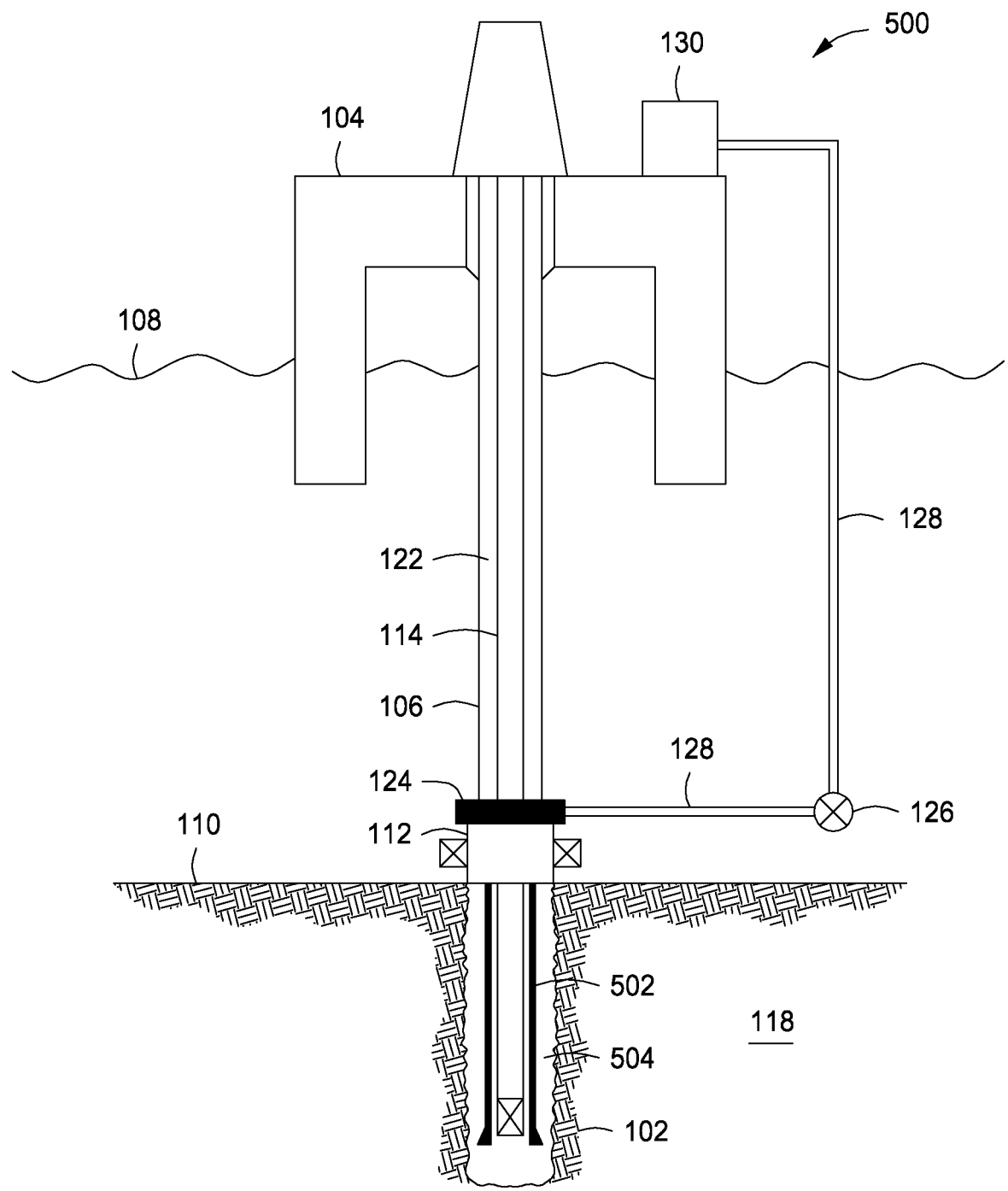
FIG. 5 illustrates a dual-gradient well system during a cementing operation, according to one or more embodiments of the present disclosure.

Referring now to FIG. 5, with continued reference to FIG. 2, illustrated is a DG well system 500 during a cementing operation. As shown, casing string 502 is disposed in the wellbore 102 and an annulus 504 is formed between the exterior of the casing string 502 and the wellbore 102. During a cementing operation, a cement slurry is pumped out of the work string 114 (e.g., using coiled tubing, jointed pipe, and the like) and into the annulus 504 between the casing string 502 and the wellbore 102. Before pumping the cement slurry, a drilling fluid and/or a spacer fluid maybe pumped through the annulus 504 and exit the wellbore 102 though the surface mud return line 128. Accordingly, the work string 114 at any given time may have one or more fluids, which are typically high-density fluids for the same reasons discussed above in maintaining balance between the pore pressure and fracture gradient pressures of the formation 118. In other instances, the end portion of the high-density fluid (i.e., the trailing end of the fluid) may be in the work string 114 at any location along the length of the work string 114. This location with reference to the work-string 114 is termed "top-of-mud." The term "top-of-mud" additionally applies to other components of the DG system and means the highest point in which a fluid (e.g., a cement slurry, or other fluids such as spacer fluids, drilling mud, and the like, for placement in a wellbore) is located within a work string 114, a surface mud return line, or other fluid flow line in a circulating DG system.

Figure 6:
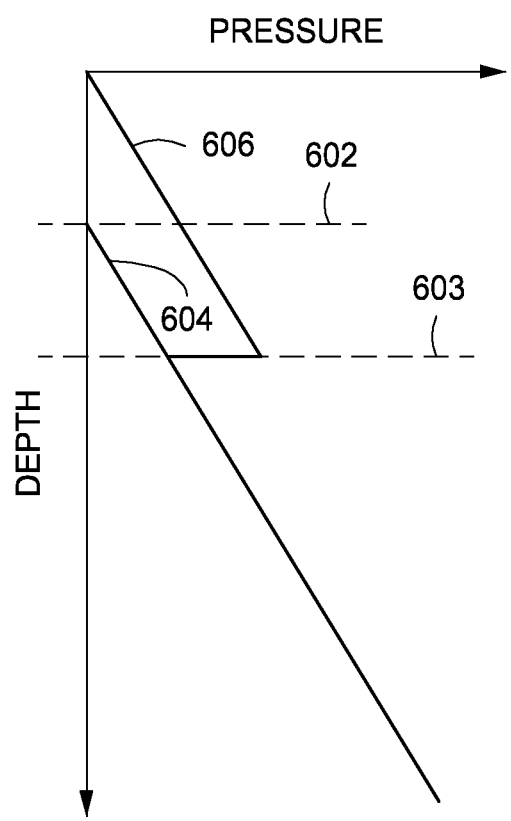
FIG. 6 is a graph illustrating the difference in hydrostatic pressures experienced by a work string that has been lifted toward the seafloor and annuli in a dual-gradient system, according to one or more embodiments of the present disclosure.

Referring now to FIG. 6, illustrated is a graph depicting the difference in pressures experienced by a work string 114 that has been lifted toward the seafloor 110 out of the wellbore 102 and annuli in a DG system 200 (FIG. 5). In FIG. 6, the x-axis represents pressure and the y-axis represents depth. Dashed line 603 is the seafloor 110 (FIG. 5), also referred to as the "mud line." Dashed line 602 is a top-of-mud in the work string 114. Line 604 represents the pressure experienced by the work string 114 and line 606 represents the pressure experienced by the annuli 122 and 120, either in the riser 106 of in the wellbore 102, respectively (FIG. 5). That is, line 606 above the seafloor 110 is the annulus 122 in the riser 106, whereas line 606 below the seafloor 110 is the annulus 120 in the wellbore 102. As shown, the work string 114 does not experience pressure until the top-of-mud is encountered, at which point it steadily grows. The pressure experienced by both annuli 122 and 120 is identical to that shown in FIG. 4; however, at the seafloor 110, the work string 114 encounters no pressure different from that of the annulus 120 in the wellbore 102 because the MLP 126 can be adjusted to ensure that the pressures are identical.

The graphs of FIGS. 3, 4, and 6 illustrate the function of a DG system. The embodiments of the present disclosure allow software simulation of such systems by assuming a 100% fluid loss situation at the location of the MLP, which may be at the seafloor or located at some distance above the seafloor 110. In doing so, the simulation methods described herein allow various fluids within the DG system to be estimated and evaluated, including fluid properties thereof. The 100% fluid loss assumption allows simulation of a DG system because it takes into account the diversion of wellbore annular fluids from the wellbore without allowing them to flow into the riser annulus.

Specifically, the embodiments herein monitor and estimate a fluid property of a modeled DG cementing system, which may be based on a hypothetical or actual subsea wellbore. Whether based on a hypothetical or actual subsea wellbore, the modeled DG cementing system (and, correspondingly, the actual DG cementing system, if applicable) comprise a plurality of components, such as those described above, including a riser coupling a drilling rig and a subsea wellhead, a mud lift pump (MLP) coupling a subsea rotating device (SRD) to a surface mud return line, a work string extending from the drilling rig through the subsea wellhead and into an interior of a casing string, and an annulus formed between an exterior of the casing string and the subsea wellbore. The MPL is located at a particular subsea depth, which is at or above the seafloor, and the SRD diverts annular fluids from the annulus of the wellbore away from the riser, as previously described.

The modeled DG cementing system, whether based on a hypothetical or actual DG system, is simulated in operation using simulation software where a fluid loss of 100% is assumed at the depth of the MLP. As such, fluid flow above the location depth of the MLP is not simulated, although as described herein, such fluid (e.g., riser fluid) may be static. While this is so, it is still within an operators ability to model certain fluid properties of the riser fluid (whether hypothetical or actual) and determine the effectiveness of such fluid based on surrounding properties using the embodiments of the present disclosure, without departing from the scope described herein.

Figure 7:
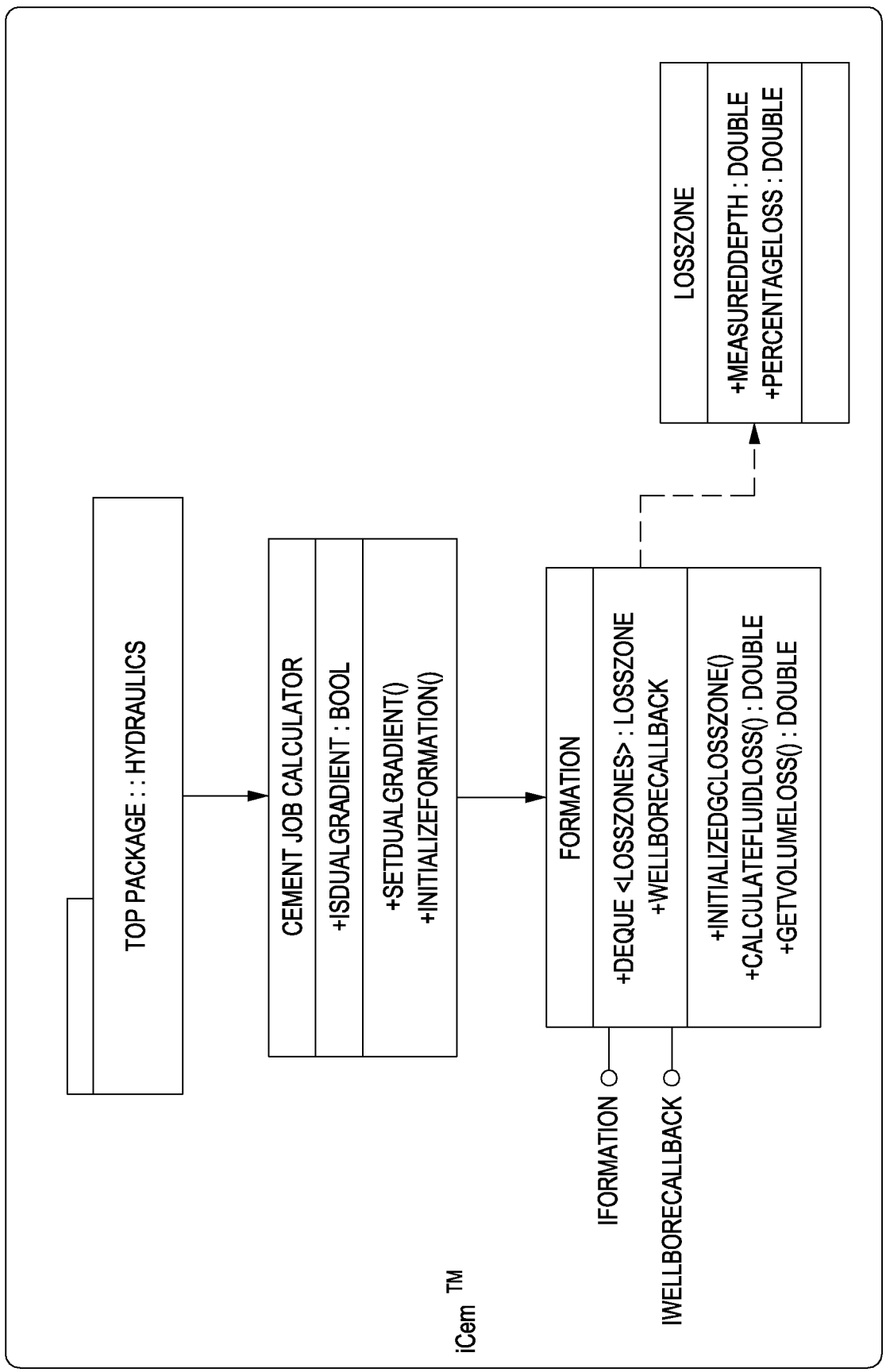
FIG. 7 illustrates a screen shot of an iCEM® service setup for implementing the systems and methods of some embodiments of the present disclosure, where a fluid loss of 100% is assumed at the depth of the MLP, which may be as a modified lost circulation case

In some embodiments, iCEM® service simulation software, available from Halliburton Energy Services, Inc. in Houston, Tex. may be used to simulate the modeled DG cementing system. Moreover, iCEM® service may be used to model the hypothetical or actual DG system as well, without departing from the scope of the present disclosure. As shown in FIG. 7, depicted is a screen shot of an iCEM® service setup for implementing the systems and methods of some embodiments of the present disclosure, where a fluid loss of 100% is assumed at the depth of the MLP, which may be as a modified lost circulation case. The setup of other simulation software systems may appear different than the iCEM® service setup shown in FIG. 7, without departing from the scope of the present disclosure, provided that the simulation software system is capable of assuming a fluid loss of 100% at the depth of the MLP.

Based on the simulated, modeled DG cementing system while in operation, a fluid property of a simulated non-static fluid may be estimated and the information gleaned from the simulation used to perform an actual dual DG cementing operation in an actual subsea wellbore, where the actual non-static fluid corresponds to the simulated non-static fluid exhibiting the estimated fluid property. That is, an actual DG cementing system that is identical in form and structure or appropriately extrapolated (e.g., size, shape, and the like) to the simulated, modeled DG cementing system is established and a DG cementing operation performed based on the information from the simulated, modeled DG cementing system.

In other embodiments, a downhole tool may be introduced into an actual DG cementing system at a depth below the depth of the MLP. The downhole tool may be a logging tool capable of taking real-time measurements while the actual DG cementing system is in operation. Simultaneous with the operating actual DG cementing system, a simulated DG cementing system based on the form and structure of the actual DG cementing system may be run. Data from the downhole tool may be input in real-time into the simulated system. Based on changes to the simulated system having the actual data input, adjustments to the actual DG cementing system while in operation may be made to avoid hazards or enhance the actual operation.

In some embodiments, a control system comprising a non-transitory medium readable for storing instructions for execution by a processor is coupled to the downhole tool, and is capable of performing the steps described herein: modeling a hypothetical or actual DG cementing system, simulating it in operation and assuming a fluid loss value of 100% at the depth of the MLP, obtaining at least one measurement from the downhole too, inputting the at least one measurement into the modeled, simulated DG cementing system, and estimating at least a fluid property of a simulated non-static fluid which corresponds to an actual non-static fluid.

Figure 8:
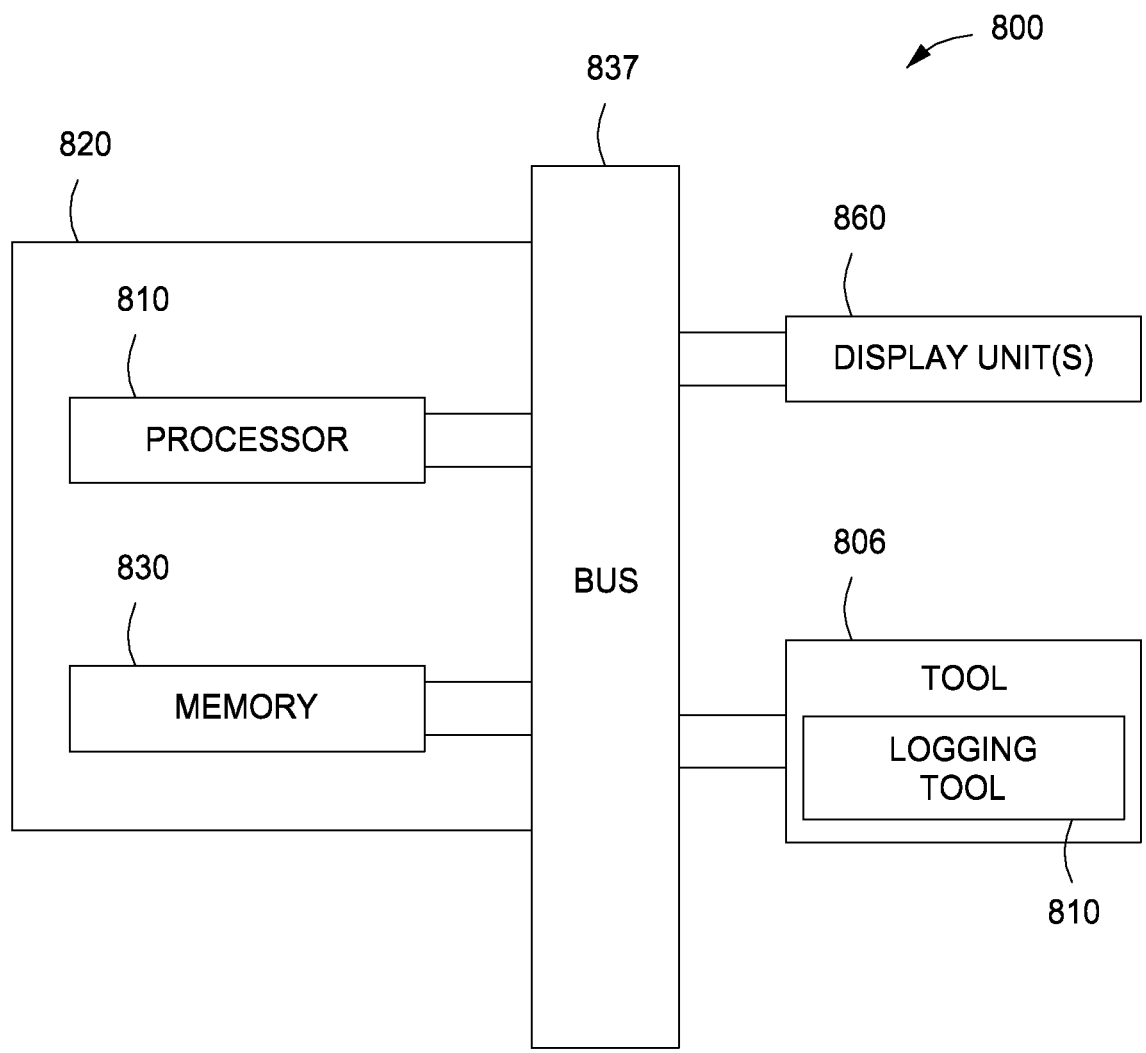
FIG. 8 is a block diagram of an example system operable to implement one or more embodiments of the present disclosure

Referring now to FIG. 8, illustrated is a block diagram of an example system 800 operable to implement the activities of multiple methods, according to various embodiments of the present disclosure. The system 800 may include a tool housing 806 having a downhole logging tool. The system 800 may be configured to operate in accordance with the teachings herein to perform modeling, simulation, measurement receipt and input into the modeled, simulation, and estimation of a fluid property of a non-static fluid, as described above.

The system 800 may include a control system 820 comprising a non-transitory readable medium, such as memory 830, for storing instructions for execution by a processor 810. The memory 830 may include, but is not limited to, read only memory (ROM), random access memory (RAM), a magnetic disk storage device, an optical storage device, a flash memory, other electronic, magnetic, and/or optical memory devices, and combinations thereof. The processor 810 may be configured to model, simulate in operation, and estimate a fluid property of a modeled, simulated DG cementing system, whether based on an actual or a simulated DG system. The processor 810 may be configured to run, for example, iCEM® service simulation software.

The system 800 may also include a bus 837, where the bus 837 provides electrical conductivity among the components of the system 800 (e.g., between the control system 820 and the logging tool 210). The bus 837 may include an address bus, a data bus, and a control bus, a wireline, each independently configured or in an integrated format. The bus 837 may be realized using a number of different communication mediums that allow for the distribution of components of the system 800. For example, the bus 837 may be a wireline or a network that allows a signal from the downhole logging tool 110 to be communicated to the control system 820, even if they are not physically in the same location (e.g., the control system 820 is located at a surface location and the downhole logging tool 110 is in a wellbore). Use of the bus 837 may be regulated by the control system 820.

The system 800 may include one or more display unit(s) 860, which may be used with instructions stored in the memory 830 to implement a user interface to monitor modeling, simulation, input, and estimation of the embodiments described herein and/or the operation of the logging tool 810. The user interface may be used to input parameter values received from the downhole logging tool 110. Typically, the user interface is located in close proximity to the control system 820.

As discussed above, the embodiments described herein model and simulate a DG cementing system in operation, and may further include input of real-time data, for use in estimating a fluid property of a simulated non-static fluid in the modeled, simulated DG system, which may correspond to an actual non-static fluid in an actual DG cementing operation (e.g., one being performed simultaneously with the simulation). The non-static fluid may include, but is not limited to, a drilling mud, a spacer fluid, a cement slurry, and any combination thereof.

The fluid property may be one or more of a fluid pressure, a fluid position, a flow rate, a fluid quality, and any combination thereof. Fluid pressure refers to both hydrostatic pressure and fluid friction. Hydrostatic pressure is the pressure exerted by gravity at a given point within a fluid, which increases with depth from the surface. Fluid friction refers to friction that occurs in fluids moving relative to a surface (e.g., relative to the casing string, the work string, the wellbore, and the like, and combinations thereof). Fluid position refers to the location of a particular fluid (e.g., when two or more fluids are in a work string, an annulus, or a surface mud return line) and may refer to any location throughout the system of the DG cementing system, including the wellbore, the riser, the surface mud return line, and the like. A fluid quality refers to a characteristic (e.g., rheology) of the fluid itself including, but not limited to, viscosity, density, temperature, pressure, and the like, and any combination thereof. Combinations of these fluid properties can also be estimated, such as fluid position for one or more steps during a cementing operation and associated fluid pressure at particular points during such one or more steps. For example, the simulation software may perform iterative fluid pressure and fluid flow rate estimations at various fluid positions.

In some embodiments, the fluid property that is estimated is hydrostatic pressure in an annulus between a casing string and a wellbore (i.e., the annulus 504 in FIG. 5), where the target hydrostatic pressure is between a pore pressure of the subsea wellbore and a fracture gradient of the subsea wellbore, as discussed previously. When the estimated hydrostatic pressure in the annulus is outside of the target hydrostatic pressure between the pore pressure and fracture gradients of the wellbore, corrective action may be taken by an operator. Indeed, one or more components of the modeled, simulated DG cementing system may be manipulated based on the information gleaned from the one or more estimated fluid properties of the simulated non-static fluid. The manipulation may be for any reason, such as to increase the effectiveness of the modeled, simulated DG cementing system, to ensure that the hydrostatic pressure is on target, to increase the efficiency of the simulated DG cementing system, and the like, and combinations thereof.

Such manipulation may include, but is not limited to, manipulating the modeled DG system itself, which is only possible when the modeled DG system is based on a hypothetical system, and not an already existing actual system. Manipulation of the system may include increasing or decreasing the width of the wellbore, increasing or decreasing the width of the riser, increasing or decreasing the speed of the MLP, increasing or decreasing the pressure of the MLP, increasing or decreasing the rate of drilling, increasing or decreasing the size and amount of casing strings, increasing or decreasing the size of the annulus between the casing strings and the wellbore, and the like, and any combination thereof.

Manipulation of the fluid property of the simulated non-static fluid may additionally be employed including, but not limited to, the flow rate of the non-static fluid, the fluid pressure of the non-static fluid, the density of the non-static fluid, the viscosity of the non-static fluid, the friction of the non-static fluid, and the like, and any combination thereof. For example, the density and/or viscosity of the simulated non-static fluid may be manipulated by simulating foaming of the fluid, introducing weighting agents, introducing suspension agents, and the like, and any combination thereof. In another example, the frication of the simulated non-static fluid may be manipulated by simulating introduction of a friction reducing agent.

After one or more elements of the modeled, simulated DG cementing system and/or the simulated non-static fluid are manipulated and the modeled, simulated DG cementing system is desirably operating, an actual DG cementing system may be constructed and the DG cementing operation performed with the knowledge gleaned from the modeled, simulated DG cementing system in which the actual DG cementing system is now modeled after. Accordingly, the manipulations used to enhance the modeled, simulated DG system are used to perform the actual DG cementing operation.

In some embodiments, an actual DG cementing operation is performed simultaneously with a modeled, simulated DG operation, where the modeled, simulated DG operation is based on the parameters (system and fluid parameters) of the actual operation. A downhole logging tool can be used to input real-time measurements from the actual DG cementing operation into the modeled, simulated DG operation. The real-time measurements may include fluid flow, density, temperature, pressure, and the like. By inputting the real-time measurements into the modeled, simulated DG system, the effects of the real-time measurements on the system as a whole can be monitored and any manipulations that can increase the effectiveness or efficiency of the actual DG cementing operation can be identified. These manipulations include any such manipulations previously discussed. The manipulations may first be made to the modeled, simulated DG system and, if effective or desirable, made in near real-time to the actual DG cementing system in operation. Accordingly, for example, the actual density, viscosity, friction, and the like of the actual non-static fluid in the actual DG cementing system is manipulated based on the data from the modeled, simulated DG system. For example, the actual non-static fluid may be foamed, or may have included any of the additional components described herein (e.g., weighting agents, and the like), or by any other means to achieve the desired manipulation results.

Embodiments herein include:

A method comprising: (a) modeling a dual gradient cementing system in a modeled subsea wellbore, wherein the modeled dual gradient cementing system comprises a plurality of components including a riser coupling a drilling rig and a subsea wellhead, a mud lift pump (MLP) coupling a subsea rotating device (SRD) to a surface mud return line, a work string extending from the drilling rig through the subsea wellhead and into an interior of a casing string, and an annulus formed between an exterior of the casing string and the subsea wellbore, wherein the MLP is located at a subsea depth, and wherein the SRD diverts annular fluids from the annulus away from the riser; (b) simulating the modeled dual gradient cementing system in operation, wherein a fluid loss value of 100% at the subsea depth of the MLP is assumed; (c) estimating a fluid property of a simulated non-static fluid in the simulated dual gradient cementing system while in operation; (d) performing an actual dual gradient cementing operation in an actual subsea wellbore, wherein an actual non-static fluid corresponding to the simulated non-static fluid exhibits the fluid property.

Embodiments A may have one or more of the following additional elements in any combination:

Element A1: Wherein the fluid property is selected from the group consisting of a fluid pressure, a fluid position, a flow rate, a fluid quality, and any combination thereof.

Element A2: Wherein the simulated non-static fluid is selected from the group consisting of a drilling mud, a spacer fluid, a cement slurry, and any combination thereof.

Element A3: Wherein the fluid property is hydrostatic pressure in the annulus, and a target of the hydrostatic pressure is between a pore pressure of the subsea wellbore and a fracture gradient of the subsea wellbore.

Element A4: Further comprising manipulating one or more components of the modeled, simulated dual gradient cementing system or a characteristic of the simulated non-static fluid prior to step (d).

Element A5: Further comprising manipulating a pump rate of the MLP prior to step (d).

Element A6: Further comprising manipulating a pump pressure of the MLP prior to step (d).

Element A7: Further comprising manipulating a flow rate of the simulated non-static fluid prior to step (d).

Element A8: Further comprising manipulating a fluid pressure of the simulated non-static fluid prior to step (d).

Element A9: Further comprising manipulating a density of the simulated non-static fluid prior to step (d).

Element A10: Further comprising manipulating a viscosity of the simulated non-static fluid prior to step (d).

Element A11: Further comprising manipulating at least one of the density and/or the viscosity of the simulated non-static fluid prior to step (d), and wherein the manipulation comprises simulated foaming of the simulated non-static fluid.

By way of non-limiting example, exemplary combinations applicable to Embodiment A include: A1-A11; A1, A3, and A5; A6 and A7; A4, A8, A9, and A10; A2 and A6; A1, A4 and A11; and the like.

A method comprising: (a) introducing a downhole logging tool into an actual dual gradient cementing system while in operation in a subsea wellbore, wherein the actual dual gradient cementing system comprises a plurality of components including a riser coupling a drilling rig and a subsea wellhead, a mud lift pump (MLP) coupling a subsea rotating device (SRD) to a surface mud return line, a work string extending from the drilling rig through the subsea wellhead and into an interior of a casing string, and an annulus formed between an exterior of the casing string and the subsea wellbore, wherein the MLP is located at a first subsea depth, wherein the SRD diverts annular fluids from the annulus away from the riser, and wherein the downhole logging tool is located at a second subsea depth below the MLP; (b) modeling the actual dual gradient cementing system, including the plurality of components, the first subsea depth, and the second subsea depth; (c) simulating the modeled dual gradient cementing system in operation, wherein a fluid loss value of 100% at the first subsea depth of the MLP is assumed, and (d) obtaining at least one measurement from the downhole logging tool; (e) inputting the at least one measurement from the downhole logging tool into the modeled, simulated dual gradient cementing system while in operation; and (f) estimating a fluid property of a simulated non-static fluid in the modeled dual gradient cementing system while in operation, wherein the simulated non-static fluid corresponds with an actual non-static fluid in the actual dual gradient while in operation.

Embodiments B may have one or more of the following additional elements in any combination:

Element B1: Wherein the fluid property is selected from the group consisting of a fluid pressure, a fluid position, a flow rate, a fluid quality, and any combination thereof.

Element B2: Wherein the simulated non-static fluid is selected from the group consisting of a drilling mud, a spacer fluid, a cement slurry, and any combination thereof.

Element B3: Wherein the fluid property is hydrostatic pressure in the annulus, and a target of the hydrostatic pressure is between a pore pressure of the subsea wellbore and a fracture gradient of the subsea wellbore.

Element B4: Further comprising manipulating one or more components of the actual dual gradient cementing system or a characteristic of the actual non-static fluid after step (f).

By way of non-limiting example, exemplary combinations applicable to Embodiment B include: B1 and B2; B1 and B3; B3 and B4; B2 and B3; B2 and B4; B3 and B4; B1-B4; B1, B2, and B3; B1, B2, and B4; B2, B3, and B4; B1, B3 and B3; and the like.

Embodiment C: A system comprising: an actual dual gradient cementing system in a subsea wellbore, the dual gradient cementing system comprising: a plurality of components including a riser coupling a drilling rig and a subsea wellhead, a mud lift pump (MLP) coupling a subsea rotating device (SRD) to a surface mud return line, a work string extending from the drilling rig through the subsea wellhead and into an interior of a casing string, and an annulus formed between an exterior of the casing string and the subsea wellbore, wherein the MLP is located at a first subsea depth, and wherein the SRD diverts annular fluids from the annulus away from the riser; a downhole logging tool located in the actual dual gradient cementing system located at a second subsea depth below the MLP; a control system coupled to the downhole logging tool, the control system comprising a non-transitory medium readable for storing instructions for execution by a processor for performing a method comprising: (a) modeling the actual dual gradient cementing system, including the plurality of components, the first subsea depth, and the second subsea depth; (b) simulating the modeled dual gradient cementing system in operation, wherein a fluid loss value of 100% at the first subsea depth of the MLP is assumed, and (c) obtaining at least one measurement from the downhole logging tool; (d) inputting the at least one measurement from the downhole logging tool into the modeled, simulated dual gradient cementing system while in operation; and (e) estimating a fluid property of a simulated non-static fluid in the modeled dual gradient cementing system while in operation, wherein the simulated non-static fluid corresponds with an actual non-static fluid in the actual dual gradient while in operation.

Embodiments C may have one or more of the following additional elements in any combination:

Element C1: Wherein the fluid property is selected from the group consisting of a fluid pressure, a fluid position, a flow rate, a fluid quality, and any combination thereof.

Element C2: Wherein the simulated non-static fluid is selected from the group consisting of a drilling mud, a spacer fluid, a cement slurry, and any combination thereof.

Element C3: Wherein the fluid property is hydrostatic pressure in the annulus, and a target of the hydrostatic pressure is between a pore pressure of the subsea wellbore and a fracture gradient of the subsea wellbore.

Element C4: Further comprising manipulating one or more components of the actual dual gradient cementing system or a characteristic of the actual non-static fluid after step (e).

By way of non-limiting example, exemplary combinations applicable to Embodiment C include: C1 and C2; C1 and C3; C3 and C4; C2 and C3; C2 and C4; C3 and C4; C1-C4; C1, C2, and C3; C1, C2, and C4; C2, C3, and C4; C1, C3 and C3; and the like.

Therefore, the disclosed systems and methods are well adapted to attain the ends and advantages mentioned as well as those that are inherent therein. The particular embodiments disclosed above are illustrative only, as the teachings of the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope of the present disclosure. The systems and methods illustratively disclosed herein may suitably be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces. If there is any conflict in the usages of a word or term in this specification and one or more patent or other documents that may be incorporated herein by reference, the definitions that are consistent with this specification should be adopted.

What is claimed is:

1. A method comprising:
   (a) modeling a dual gradient cementing system in a modeled subsea wellbore,
      wherein the modeled dual gradient cementing system comprises a plurality of cementing components including a riser coupling a drilling rig and a subsea wellhead, a mud lift pump (MLP) coupling a subsea rotating device (SRD) to a surface mud return line, a work string comprising a conveyance for delivering cement slurry extending from the drilling rig through the subsea wellhead and into an interior of a casing string, and an annulus formed between an exterior of the casing string and the subsea wellbore,
      wherein the MLP is located at a subsea depth, and
      wherein the SRD diverts annular fluids from the annulus away from the riser;
   (b) simulating the modeled dual gradient cementing system in operation,
      wherein a fluid loss value of 100% at the subsea depth of the MLP is assumed;
   (c) estimating a fluid property of a simulated non-static fluid in the simulated dual gradient cementing system while in operation;
   (d) performing an actual dual gradient cementing operation in an actual subsea wellbore, wherein an actual non-static fluid corresponding to the simulated non-static fluid exhibits the fluid property.

2. The method of claim 1, wherein the fluid property is selected from the group consisting of a fluid pressure, a fluid position, a flow rate, a fluid quality, and any combination thereof.

3. The method of claim 1, wherein the simulated non-static fluid is selected from the group consisting of a drilling mud, a spacer fluid, a cement slurry, and any combination thereof.

4. The method of claim 1, wherein the fluid property is hydrostatic pressure in the annulus, and a target of the hydrostatic pressure is between a pore pressure of the subsea wellbore and a fracture gradient of the subsea wellbore.

5. The method of claim 1, further comprising manipulating one or more components of the modeled, simulated dual gradient cementing system or a characteristic of the simulated non-static fluid prior to step (d).

6. The method of claim 1, further comprising manipulating a pump rate of the MLP prior to step (d).

7. The method of claim 1, further comprising manipulating a pump pressure of the MLP prior to step (d).

8. The method of claim 1, further comprising manipulating a flow rate of the simulated non-static fluid prior to step (d).

9. The method of claim 1, further comprising manipulating a fluid pressure of the simulated non-static fluid prior to step (d).

10. The method of claim 1, further comprising manipulating a density of the simulated non-static fluid prior to step (d).

11. The method of claim 1, further comprising manipulating a viscosity of the simulated non-static fluid prior to step (d).

12. The method of claim 1, further comprising manipulating at least one of the density and/or the viscosity of the simulated non-static fluid prior to step (d), and wherein the manipulation comprises simulated foaming of the simulated non-static fluid.

13. A method comprising:
(a) introducing a downhole logging tool into an actual dual gradient cementing system while in operation in a subsea wellbore,
wherein the actual dual gradient cementing system comprises a plurality of cementing components including a riser coupling a drilling rig and a subsea wellhead, a mud lift pump (MLP) coupling a subsea rotating device (SRD) to a surface mud return line, a work string comprising a conveyance for delivering cement slurry extending from the drilling rig through the subsea wellhead and into an interior of a casing string, and an annulus formed between an exterior of the casing string and the subsea wellbore,
wherein the MLP is located at a first subsea depth,
wherein the SRD diverts annular fluids from the annulus away from the riser, and
wherein the downhole logging tool is located at a second subsea depth below the MLP;
(b) modeling the actual dual gradient cementing system, including the plurality of components, the first subsea depth, and the second subsea depth;
(c) simulating the modeled dual gradient cementing system in operation,
wherein a fluid loss value of 100% at the first subsea depth of the MLP is assumed, and
(d) obtaining at least one measurement from the downhole logging tool;
(e) inputting the at least one measurement from the downhole logging tool into the modeled, simulated dual gradient cementing system while in operation; and
(f) estimating a fluid property of a simulated non-static fluid in the modeled dual gradient cementing system while in operation, wherein the simulated non-static fluid corresponds with an actual non-static fluid in the actual dual gradient while in operation.

14. The method of claim 13, wherein the fluid property is selected from the group consisting of hydrostatic pressure, fluid position, a fluid flow rate, a fluid quality, and any combination thereof.

15. The method of claim 13, wherein the simulated and actual non-static fluid is selected from the group consisting of a drilling mud, a spacer fluid, a cement slurry, and any combination thereof.

16. The method of claim 13, wherein the fluid property is hydrostatic pressure in the annulus, and a target of the hydrostatic pressure is between a pore pressure of the subsea wellbore and a fracture gradient of the subsea wellbore.

17. The method of claim 13, further comprising manipulating one or more components of the actual dual gradient cementing system or a characteristic of the actual non-static fluid after step (f).

18. A system comprising:
an actual dual gradient cementing system in a subsea wellbore, the dual gradient cementing system comprising:
a plurality of cementing components including a riser coupling a drilling rig and a subsea wellhead,
a mud lift pump (MLP) coupling a subsea rotating device (SRD) to a surface mud return line,
a work string comprising a conveyance for delivering cement slurry extending from the drilling rig through the subsea wellhead and into an interior of a casing string, and
an annulus formed between an exterior of the casing string and the subsea wellbore,
wherein the MLP is located at a first subsea depth, and
wherein the SRD diverts annular fluids from the annulus away from the riser;
a downhole logging tool located in the actual dual gradient cementing system located at a second subsea depth below the MLP;
a control system coupled to the downhole logging tool, the control system comprising a non-transitory medium readable for storing instructions for execution by a processor for performing a method comprising:
(a) modeling the actual dual gradient cementing system, including the plurality of components, the first subsea depth, and the second subsea depth;
(b) simulating the modeled dual gradient cementing system in operation, wherein a fluid loss value of 100% at the first subsea depth of the MLP is assumed, and
(c) obtaining at least one measurement from the downhole logging tool;
(d) inputting the at least one measurement from the downhole logging tool into the modeled, simulated dual gradient cementing system while in operation; and
(e) estimating a fluid property of a simulated non-static fluid in the modeled dual gradient cementing system while in operation,
wherein the simulated non-static fluid corresponds with an actual non-static fluid in the actual dual gradient while in operation.

19. The system of claim 18, wherein the fluid property is selected from the group consisting of a fluid pressure, a fluid position, a fluid flow rate, a fluid quality, and any combination thereof.

20. The system of claim 18, wherein the fluid property is hydrostatic pressure in the annulus, and the hydrostatic pressure is between a pore pressure of the subsea wellbore and a fracture gradient of the subsea wellbore.

* * * * *